United States Patent [19]
Sibigtroth et al.

[11] Patent Number: 6,009,012
[45] Date of Patent: Dec. 28, 1999

[54] MICROCONTROLLER HAVING A NON-VOLATILE MEMORY AND A METHOD FOR SELECTING AN OPERATIONAL MODE

[75] Inventors: James M. Sibigtroth, Round Rock; Michael C. Wood, Pflugerville; Linda R. Nuckolls; Daniel Mark Thompson, both of Austin, all of Tex.

[73] Assignee: Motorola Inc., Schaumburg, Ill.

[21] Appl. No.: 09/089,719

[22] Filed: Jun. 3, 1998

[51] Int. Cl.[6] .................................................. G11C 16/04
[52] U.S. Cl. ................................ 365/185.04; 365/185.05
[58] Field of Search ...................... 365/185.04, 185.05, 365/185.03; 711/166, 154

[56] References Cited

U.S. PATENT DOCUMENTS

| | | | |
|---|---|---|---|
| 3,978,454 | 8/1976 | Willard | 340/172.5 |
| 5,239,656 | 8/1993 | Kawano | 395/800 |
| 5,495,593 | 2/1996 | Elmer et al. | 395/430 |
| 5,652,886 | 7/1997 | Tulpule et al. | 395/652 |

*Primary Examiner*—David Nelms
*Assistant Examiner*—Anh Phung

[57] ABSTRACT

A method for automatically detecting a programmed status of a non-volatile memory and selecting one of multiple operational modes based on that status. In one embodiment a non-volatile memory (102) has a normal and an access restricted operational mode. The memory is placed in the access restricted operational mode once it is programmed in order to prevent unauthorized access to the programmed data. A detection logic (226) determines whether the non-volatile memory is in a non-programmed state. Based on this detection it is determined whether the non-volatile memory is to be placed in a normal or an access restricted operational mode. The invention relates also to determining an operational mode of the microcontroller which can advantageously be incorporated into an assembled electronic device.

19 Claims, 4 Drawing Sheets

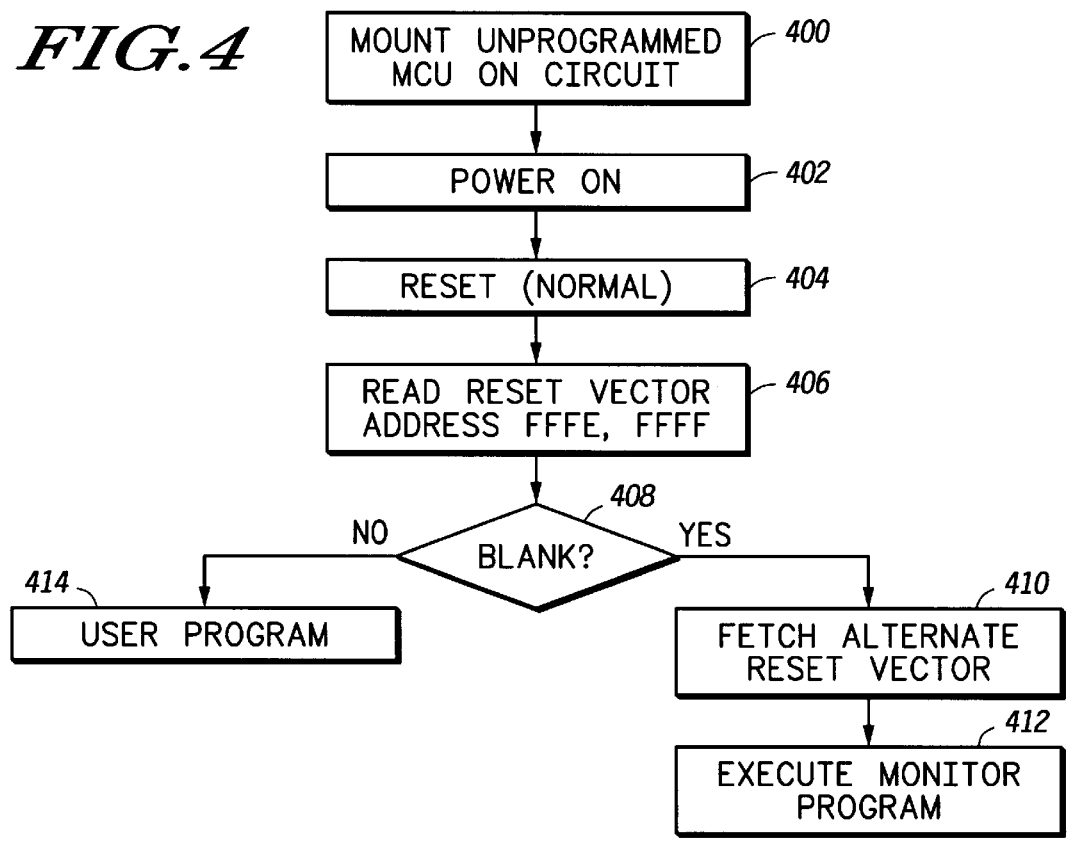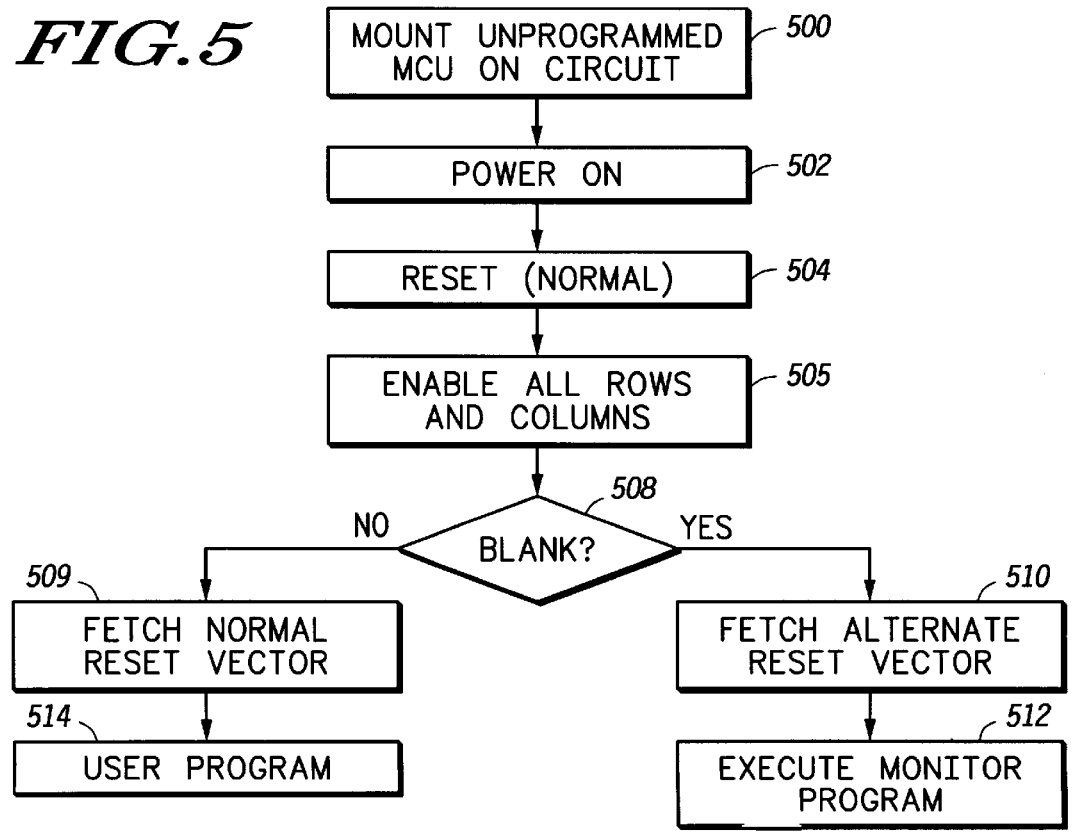

MICROCONTROLLER HAVING A NON-VOLATILE MEMORY AND A METHOD FOR SELECTING AN OPERATIONAL MODE

FIELD OF THE INVENTION

The invention relates to the field of non-volatile memories, microcontrollers and in particular, the programming of a non-volatile memory.

BACKGROUND OF THE INVENTION

From the prior art a number of techniques are known to program a non-volatile memory including boot strap techniques, background debug mode or special operating modes. The prior art techniques have in common that they require special pins and/or voltages to force the microprocessor into a special operating mode that allows programming of the non-volatile memory. This approach has the drawback that additional pins are required which are expensive in terms of silicon space usage and packaging costs for low pin-count parts. Further, programming of the non-volatile memory usually requires connecting the memory to special programming equipment and is thus not possible when the memory is built into a circuit.

There is a need for a user-programmable memory non-volatile memory applicable to microcontroller devices which facilitates easy programming of user memory.

BRIEF DESCRIPTION OF THE DRAWINGS

FIG. 4 shows a flow chart of a first embodiment of a method to control a microcontroller according to the invention;

FIG. 5 shows a second embodiment of a method to control a microcontroller according to the invention.

DETAILED DESCRIPTION OF A PREFERRED EMBODIMENT

Figure 1:
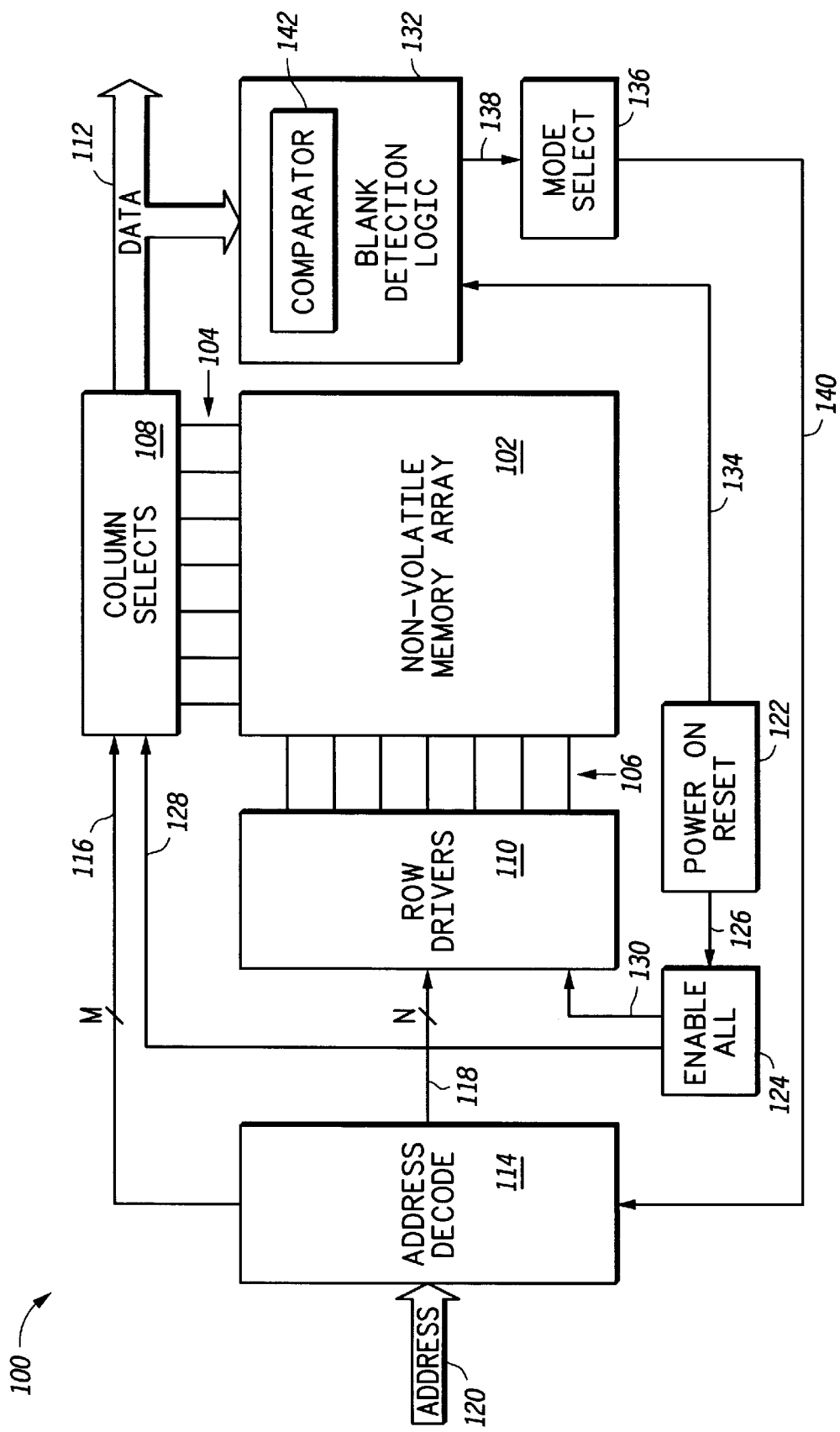
FIG. 1 shows an embodiment of a user-programmable non-volatile memory according to the invention.

According to the present invention, a method for selecting an operational mode of a non-volatile memory, where the memory has a normal and an access restricted operational mode, includes the steps of: performing a power on reset sequence; detecting an unprogrammed state of the non-volatile memory based on a content of the non-volatile memory; selecting the normal operational mode if the unprogrammed state is detected.

According to one aspect of the present invention, a microcontroller, having a non-volatile memory for storing an application program, includes a read only memory for storing a control program, a processing unit coupled to the non-volatile memory and the read only memory, the processing unit executing programs in the microcontroller, and control logic for selecting between the application program and the control program for execution by the processing unit based on the signal.

According to another aspect of the present invention, a non-volatile memory includes a power on reset circuit; detection logic coupled to the power on reset circuit, the detection logic being enabled by the power on reset circuit when power is applied to the non-volatile memory, the detection logic adapted to detect an unprogrammed state of the non-volatile memory, the detection logic adapted to generate a signal which indicates an unprogrammed state; and a mode selection circuit coupled to the detection logic, in response to receiving the signal from the detection logic the mode selection circuit selecting a normal and an access restricted operational mode for the non-volatile memory.

According to still another aspect of the present invention, a method selecting an operational mode of a non-volatile involves selecting all rows and all columns of the non-volatile memory, and then simultaneously accessing all storage locations within the non-volatile memory. The method then determines if values stored in all storage locations store are equal to a predetermined logic value representative of the unprogrammed state, and makes a mode decision based on the state of the memory.

In the following description, numerous specific details are set forth such as specific control register bit lengths, etc. to provide a thorough understanding of the present invention. However, the present invention may be practiced without such specific details. In other instances, circuits have been shown in block diagram as illustrative of functional aspects of the present invention.

The term "bus" will be used to refer to a plurality of signals or conductors which may be used to transfer one or more various types of information, such as data, addresses, control, or status. The term conductor may refer to one or to multiple conductive elements. The terms "assert" and "negate" will be used when referring to the rendering of a signal, status bit, or similar apparatus into its logically true or logically false state, respectively. If the logically true state is a logic level one, the logically false state will be a logic level zero. And if the logically true state is a logic level zero, the logically false state will be a logic level one.

FIG. 1 illustrates a non-volatile memory 100. The non-volatile memory 100 has a memory array 102. The memory array 102 can be implemented in any kind of technology for producing non-volatile storage cells which preserve the contents of a stored data even after power is switched off. In the preferred embodiment considered here, the memory array 102 is implemented as a programmable read only memory. The memory array 102 is coupled to column select logic 108 via conductors 104, and to row drivers 110 via conductors 106. In a normal operational mode the row drivers 110 and the column select logic 108 serve to access a particular storage location within the memory array 102. This is done by activating the row driver of the row drivers 110 belonging to the row in which the storage location to be accessed is situated and concurrently selecting the column in which that same storage location is situated by means of column select logic 108.

This way the contents of the storage location which was accessed is output from the memory array 102 through one of the conductors 104 through the column select logic 108 and provided to data bus 112, which is coupled to the column select logic 108. Both the column select logic 108 and the row drivers 110 are coupled to address decode unit 114 via the address busses 116, 118, respectively. The address bus 116 is "M" bits wide and the address bus 118 is "N" bits wide corresponding to the respective dimensions of the memory array 102. The address decode unit 114 is connected to address bus 120 to receive the address of a storage location within the memory array 102 which is to be accessed.

Further, the non-volatile memory 100 has power on reset circuit 122. The power on reset circuit 122 is activated when power is applied to the non-volatile memory 100 in order to initialize the operation of the non-volatile memory 100. In the preferred embodiment of FIG. 1, the power on reset circuit 122 is coupled to enable logic 124 via conductor 126. The enable logic 124 is coupled to the column select logic 108 and to the row drivers 110 via conductors 128, 130, respectfully. The power on reset circuit 122 is also coupled to blank detection logic 132 via conductor 134.

In the example considered here, the blank detection logic 132 has a comparator 142. The comparator 142 serves to compare a data word provided to the blank detection logic 132 via data bus 112 to a predetermined logic value stored within the blank detection logic 132. The blank detection logic 132 is coupled to mode select logic 136 via conductor 138. The mode select logic 136 is coupled via conductor 140 to the address decode unit 114.

According to the status of the mode select logic 136 access to the memory array 102 is either performed in a normal or an access restricted operational mode. In the normal operational mode any of the storage locations within the memory array 102 can be randomly accessed without any restriction. As opposed to this, in the access restricted operational mode a read and/or write access to the memory array 102 is restricted. The restriction can apply to a certain portion of the memory array 102 so that an attempted access to that portion is blocked by the address decode unit 114. Another example for access protection is password or code protection of the access to the memory array 102. Such access restrictions are used to prevent access to sensitive data stored in the memory array 102 against unauthorized access.

When power is applied to the non-volatile memory 100 the power on reset circuit 122 is activated and issues a signal to the enable logic 124 via conductor 126. In response, the enable logic 124 activates the conductors 128 and 130 to simultaneously select all row drivers 110 and select all columns through column select logic 108. If any of the storage cells of the memory array 102 had been programmed, this will result in outputting the programmed data value through one of the conductors 104 through the column select logic 108 onto the data bus 112. If none of the storage cells of the memory array 102 have been programmed no programmed data value is output and the status of the data bus 112 remains idle.

The activation of the enable logic 124 by the power on reset circuit 122 is also signaled to the blank detection logic 132 by activating conductor 134. In response, the blank detection logic 132 "snoops" on data bus 112. The snooping allows for monitoring of data bus 112 to data values output to data bus 112 in response to the selection of all the row drivers 110 and all the column selects 108. Specifically, if the blank detection logic 132 recognizes a programmed data value on the data bus 112 when the conductor 134 is still active, it is thereby detected that at least one of the storage cells of the memory array 102 had been programmed and that the memory 102 is therefore in a programmed state. If however, blank detection logic 132 detects no data value on the data bus 112, then the memory array 102 is in an unprogrammed state, where no storage cell of the memory array 102 is in a programmed state. Based on that detection the blank detection logic 132 issues a signal via conductor 138; this results in the selection of the normal operational mode. If a programmed state is detected, this results in the selection of the access restricted operational mode in order to protect the data stored in the memory array 102 against unauthorized access.

Alternatively in response to power on, not all row drivers and columns are selected, but one or more storage locations of the memory array 102 are accessed for a read operation. In the example considered here, the storage location having the address "0000" at the lower end of the address space of memory array 102 is accessed through the enable logic 124, which issues corresponding signals via the conductors 128 and 130 for the selection of the row and the column corresponding to that storage address. Enable logic 124 issues such signals in response to the signal it receives from the power on reset circuit 122. The contents of the storage location having the address "0000" which is read accessed this way, is output on the data bus 112 irrespective of whether this storage location had been previously programmed or not. Depending on the technology employed, all of the storage cells of the memory array 102 have the same default value after the production of the memory array 102 when the memory array 102 has not yet been programmed. Without restriction of generality it is assumed in this example that this default value is a logical low or "0" level.

If the data which is output from the memory array 102 in response to the read access to the storage location having the address "0000" is logical "0," that indicates that this storage location had not been programmed; likewise if the outputted data value is logical "1" that indicates that the memory array 102 had been programmed. However if the output data is logical "0," this does not necessarily mean that the whole memory array 102 has not been programmed because other storage cells of the memory array 102 might have logical values other than logical "0."

The blank detection logic 132 compares data output from the memory array 102 to a predetermined logic value. The blank detection logic 132 uses the data which is output from the memory array 102 in response to the read access from the address indicated on address bus 120. The blank detection logic 132 compares the data to a predetermined logic value by means of the comparator 142. In the example considered here the predetermined logic value equals logical "0." If the data does not equal the predetermined logic value this indicates that the memory array 102 has been programmed, i.e. a programmed state is detected. A comparison result that the data is equal to the predetermined logic value indicates that the respective storage location having the address "0000" of the memory array 102 had not been programmed, i.e. this address is not in a programmed state, and there is a certain likelihood for the entire memory array 102 of not having been programmed. Based on this assumption an unprogrammed state of the memory array 102 is inferred so that such a state is detected by the blank detection logic 132. As explained above, again the mode for the access restricted operational mode is selected by means of the mode select logic 136.

The preferred embodiment described with reference to FIG. 1 is particularly advantageous in that it allows the selection of a normal or an access restricted operational mode without having to apply external control signals to the non-volatile memory 100. This has the further advantage that no additional pins are required for applying such control signals so that precious silicon space is saved.

Figure 2:
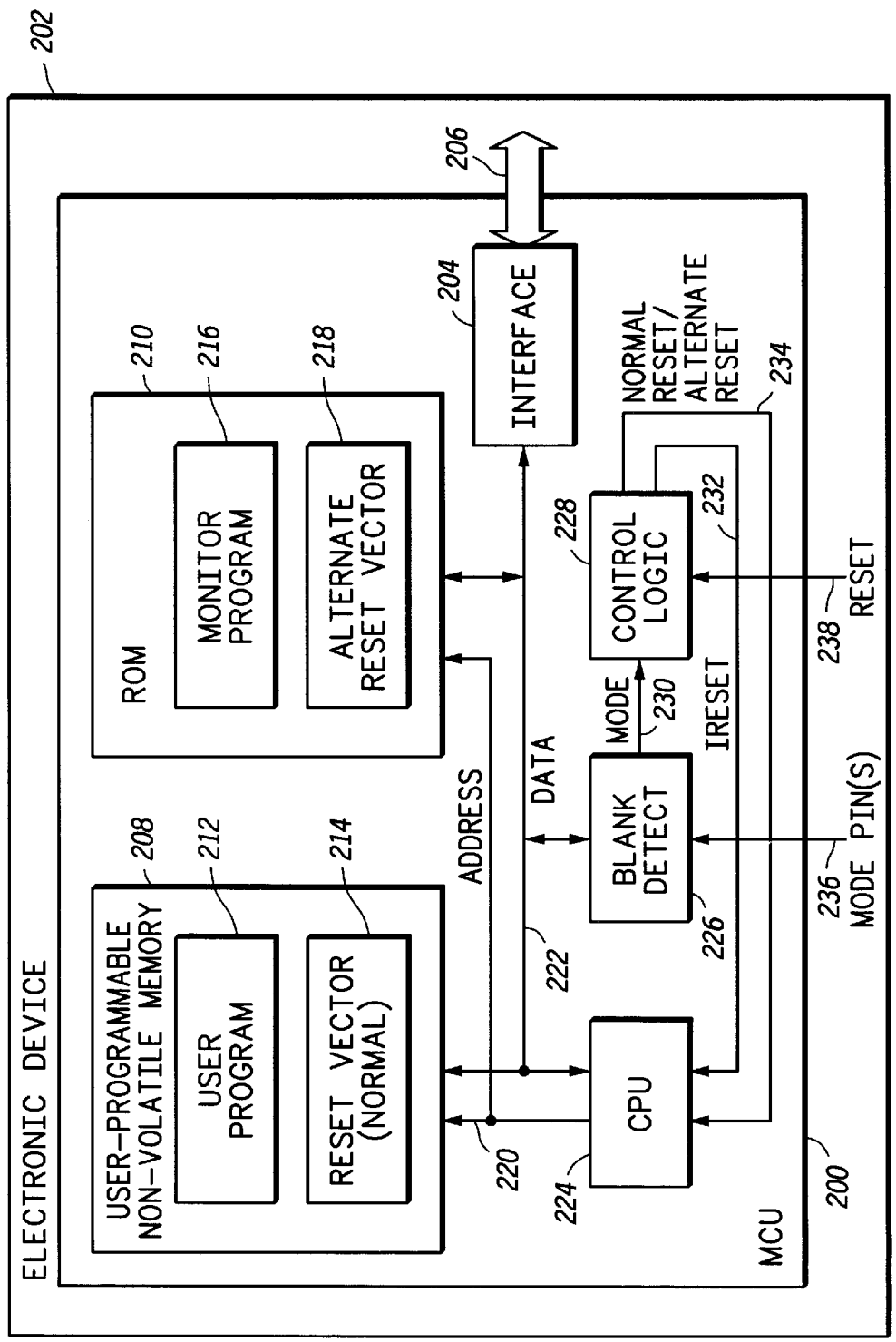
FIG. 2 shows a block diagram of a first embodiment of a microcontroller according to the invention.

With reference to FIG. 2 now a preferred embodiment of a microcontroller of the invention is shown in greater detail. The microcontroller 200 is integrated into an electronic device 202. The assembled electronic device 202 can be a hand held device such as a cellular telephone, a pager, a radio, or a video game. Also the electronic device 202 can form part of the control electronics for automotive applications. Such electronic devices rely heavily on microcontrollers of the type of the microcontroller 200 illustrated in FIG. 2 for the purposes of signal processing, control functions, or the like. For communication with the rest of the electronic device 202, the microcontroller 200 has a communication interface 204 which is connected to a bus 206.

The microcontroller 200 has user-programmable non-volatile memory 208 and read only memory 210. The non-volatile memory 208 has a memory array comprising the regions 212 and 214. In the region 212 storage space is provided for storage of a user program and in a region 214 storage space is provided for storage of a normal reset vector. The read only memory 210 has a memory array comprising regions 216 and 218 for storage of a monitor program and an alternate reset vector, respectfully. Both the non-volatile memory 208 and the read only memory 210 are coupled via address bus 220 and data bus 222 to central processing unit 224. The central processing unit can carry out a user program, in particular an application program, stored in the region 212, or a monitor program, in particular a control program, stored in the region 216.

Further the microcontroller 200 has a detection logic 226 for detecting an unprogrammed state of the non-volatile memory 208. The detection logic 226 is also coupled to the data bus 222. Further the detection logic 226 is coupled to control logic 228 via conductor 230. The control logic 228 is coupled to the central processing unit 224 via conductors 232 and 234.

The microcontroller 200 has external pins 236 and 238 being coupled to the detection logic 226 and the control logic 238, respectively. To fabricate the electronic device 202, first a printed circuit is produced, such as a printed circuit board or a printed circuit on a flex foil. Consecutively, the microcontroller 200 is mounted on the printed circuit, for example, as a surface mounted device. In order to make the assembled electronic device 202 operable, the non-volatile memory 208 of the microcontroller 200 has to be programmed in order to store an application program in the region 212. This is done as follows. Power is applied to the microcontroller 200 by turning on the electronic device 202. A reset signal is applied to the pin 238 of the microcontroller 200 and a corresponding reset signal is received in the control logic 228. The receipt of a reset signal causes the control logic 228 to issue a signal IRESET on the conductor 232 in order to signal to the central processing unit 224 that a reset is to be performed. Concurrently, the control logic 228 issues a logical "1" on the conductor 234 to indicate to the central processing unit that the reset operation to be performed is a normal reset operation. In order to perform the normal reset operation the central processing unit 224 makes a read access to the region 214 of the non-volatile memory 208 in order to access a required reset vector to perform the normal reset operation. In case the non-volatile memory 208 is still unprogrammed, no reset vector is stored in the region 214. Rather the storage cells of the non-volatile memory 208, which belong to the region 214, have a default value which can be assumed to be logical "0," without restriction of generality.

The read access to the region 214 is performed by the central processing unit 224 by putting corresponding address (es) onto the address bus 220 so that the contents of the storage cells situated within region 214 are output onto a data bus 222. The detection logic 226 snoops the data bus 222. If all of the data on the data bus 222 equals the default value of logical "0" the assumption is made that the non-volatile memory 208 is unprogrammed. This detection of a non-programmed state is signaled to the control logic 228 from the detection logic 226 via conductor 230 by issuing a MODE signal. In response, the control logic 228 immediately issues another IRESET signal on conductor 232 and changes the signal on conductor 234 to logical "0" to indicate an alternate reset to the central processing unit 224.

The consecutive IRESET signal issued by the control logic 228 terminates the previous reset sequence. The logical level of the conductor 234 indicates that an unprogrammed state of the non-volatile memory 208 had been detected so that it can be programmed. For that purpose, the central processing unit 224 carries out the alternate reset sequence by making a read access to the region 218 of the read only memory 210. This is done to read the alternate reset vector stored in the region 218 by putting the corresponding address(es) onto the address bus 220. In response the alternate reset vector is output on data bus 222 from the read only memory 210. Consecutively, the microcontroller 200 is initialized based on the alternate reset vector and the control program stored in the region 216 is carried out by the central processing unit 224.

The control program stored in the region 216 can be a test or a monitor program. In the example considered here, the program stored in the region 216 is a monitor program which allows the storage of a user or application program into the region 212 by programming the non-volatile memory 208.

Alternatively, the microcontroller 200 can be forced into the programming mode by applying a signal to the external pin 236. The detection circuit 226 then issues the MODE signal via conductor 230 to the control logic 228. The MODE signal invokes the alternative reset sequence. Note that the external pin 236 is optional as the programming of the non-volatile memory 208 can also be performed exclusively in response to the application of a reset signal to external pin 238. The microcontroller 200 does not have to be removed from the electronic device 202 for the programming of the non-volatile memory 208, adding the advantages of reduced production time, increased reliability and reduced cost.

Figure 3:
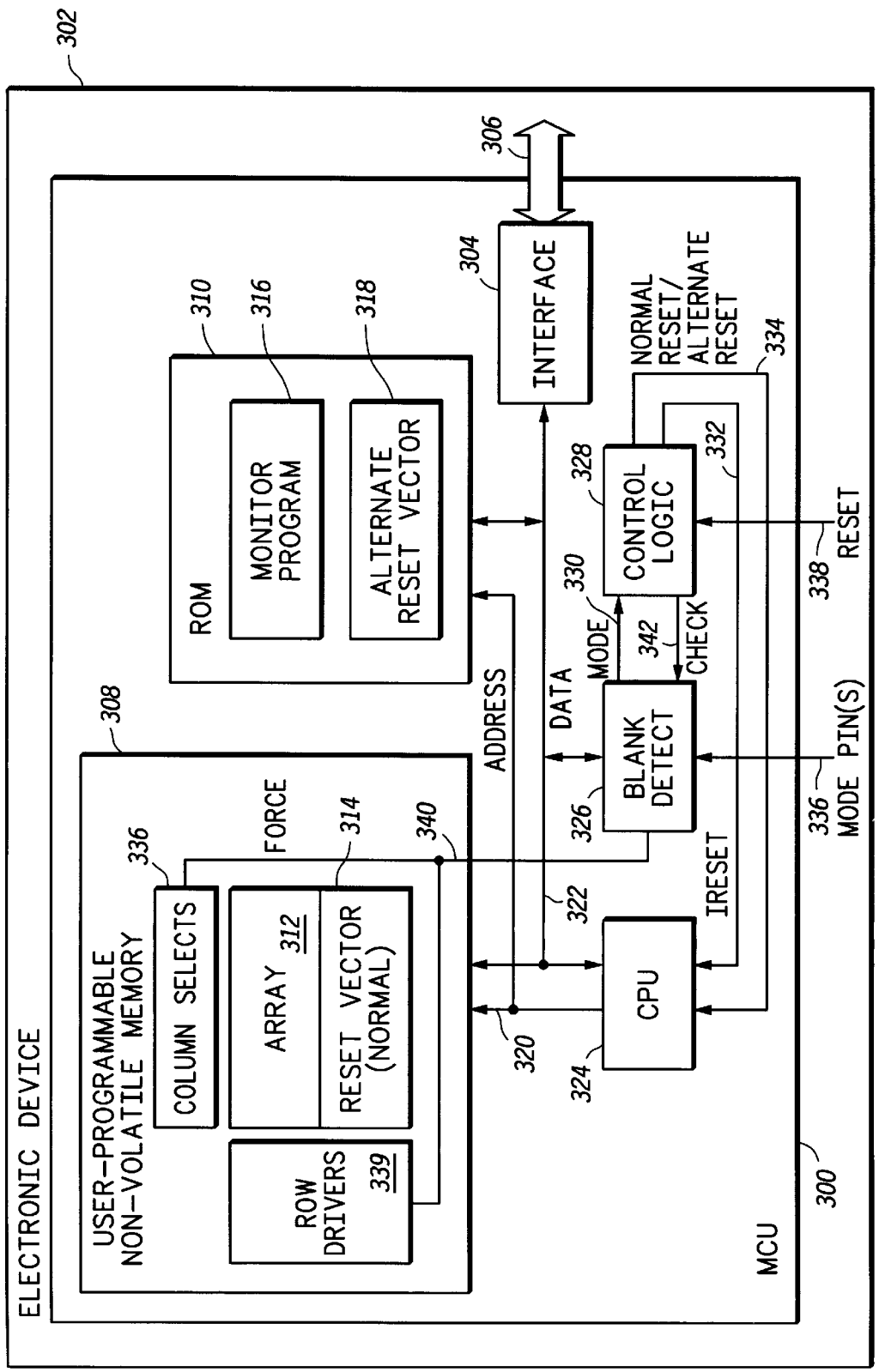
FIG. 3 shows a block diagram of a second embodiment of a microcontroller.

With reference to FIG. 3, an alternative embodiment of a microcontroller according to the invention is described in greater detail. In FIG. 3, elements corresponding to elements of the embodiment shown in FIG. 2 have like reference numerals as their corresponding counterparts in FIG. 2. The user-programmable non-volatile memory 308 of the microcontroller 300 has column selects 336 and row drivers 339. The column selects 336 and the row drivers 339 are connected via conductor 340 to the detection logic 326. In addition to the conductor 330 there are conductors 342 and 330 between the control logic 328 and the detection logic 326.

Similar to electronic device 202 of FIG. 2, electronic device 302 includes microcontroller unit (MCU) 300. MCU 300 includes user-programmable non-volatile memory 308, ROM 310, interface 304, CPU 324, blank detect 326, and control logic 328. Non-volatile memory 308 is coupled to CPU 324 and ROM 310 by way of conductor(s) 320, which provide address information. Non-volatile memory 308 is coupled to CPU 324 and interface 304 by way of conductor(s) 322, which provide data information. ROM 310 is also bi-directionally coupled to conductor(s) 322. Interface 304 communicates with other areas within electronic device 302 by way of bidirectional bus 306. ROM 310 includes monitor program areas 316 and alternate reset vector area 318. Non-volatile memory 308 includes array 312 and reset vector for normal operation stored in area 314. Row drivers 339 and column selects 336 are used to identify specific cells within memory array 312. Control logic 328 is coupled to CPU 324 by way of conductor(s) 332 and 334. External pins 336 and 338 are coupled to blank detect 326 and control logic 328 respectively.

When a reset signal is applied on the external pin 338 this causes the control logic 328 to issue the signal IRESET on the conductor 332. Simultaneously the control logic 328 issues a logical 1 to indicate a normal reset operation to the central processing unit 324. Concurrently with the initialization of the normal reset sequence, the control logic 328 issues a signal CHECK on conductor 342 to the detection logic 326. In response to the reception of the CHECK signal in the detection logic 326, the detection logic asserts the FORCE signal on conductor 340 in order to detect an unprogrammed state of the non-volatile memory 308. As a consequence both the row drivers 339 and the column selects 336 are selected. If any of the storage locations in the non-volatile memory 308 had been previously programmed the corresponding value is output on data bus 322. Since the detection logic 326 snoops the data bus 322 it is recognized by the detection logic 326 if such a data is output from the non-volatile memory 308. Detection of programmed data indicates that the non-volatile memory 308 has been previously programmed. No programmed data indicates that the non-volatile memory 308 is in an unprogrammed state, and is thus detected by the detection logic 326. Detection logic 326 then uses the MODE signal via conductor 330 to the control logic 328 to indicate the unprogrammed state.

In response to the reception of the MODE signal the control logic 328 drops the conductor 334 from logical "1" to logical "0" to indicate to the central processing unit 324 that an alternate reset operation is to be carried out upon release of the IRESET signal. In response thereto the central processing unit 324 performs a read access to the region 318 in order to read the alternate reset vector stored in this region to initialize the microcontroller 300 and to consecutively carry out the monitor program in order to program the non-volatile memory 308.

FIG. 4 illustrates, in flow diagram form, a method for manufacturing an electronic device according to one embodiment of the present invention. For the manufacturing of an electronic device, an unprogrammed microcontroller is mounted on a pre-fabricated circuit of the electronic device. This is done in step 400. At step 402 the electronic device is switched on as power is applied to the microcontroller. Thereby a normal reset procedure is invoked at step 404, where a reset vector is read from a read only memory of the microcontroller in step 406. In the example considered here, the reset vector, if any, is stored on the addresses FFFE and FFFF.

In step 408 it is evaluated whether the data read from the address locations FFFE and FFFF corresponds to the unprogrammed status of the corresponding memory locations. If this is the case, the control goes to step 410 to fetch an alternate reset vector and then execute a monitor program in step 412. This is done in order to program the non-volatile memory of the microcontroller. If it is decided at step 408 that the data read at step 406 is not blank but programmed data, a user program is carried out at step 414. The method as described with reference to FIG. 4 can advantageously be carried out by means of the electronic device 202 of FIG. 2.

FIG. 5 shows in greater detail an alternative embodiment of a method of the invention which can advantageously be carried out with the electronic device 302 of FIG. 3. Method steps of the method shown in FIG. 5 corresponding to method steps of those method of FIG. 4 having like reference numerals. At step 505 all rows and columns of the non-volatile memory of the microcontroller are enabled in order to determine whether any of the storage cells of the non-volatile memory are programmed. If any storage cells are programmed, the control goes to step 509 in which the normal reset vector is read so that consecutively a user program can be carried out in step 514. If the contrary applies the control goes to step 510 analogous to step 410 of FIG. 4.

The present invention allows for an automatic determination of the state of a non-volatile memory without the need for external pins and special voltage requirements. The present invention is applicable to a stand alone non-volatile memory, or a microcontroller including a non-volatile memory, or an assembled electronic device including a a non-volatile memory.

The method allows for detection of an unprogrammed state within the memory, and thus a control decision based on the state of the memory. In one embodiment, a microcontroller includes a non-volatile memory which stores an application program, a ROM for storing a control program, a detection means and a control means. The detection means detects an unprogrammed state of the memory and issues a signal so indicating. In response to the signal, the control means selects either the application program in non-volatile memory or the control program in ROM. Here programming of the microcontroller is available if the non-volatile memory is unprogrammed and programming is restricted if the non-volatile memory is programmed.

The present invention allows for streamlined production of devices including a non-volatile memory, where the state of the memory is detected without the need for external pins. According to one embodiment, a method for manufacturing an assembled electronic device includes the steps of mounting a microcontroller on a printed circuit, powering the electronic device, detecting if a non-volatile memory is unprogrammed, and if the non-volatile memory is unprogrammed, invoking a control program which allows programming of the non-volatile memory within the printed circuit.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

We claim:

1. A non-volatile memory, comprising:
   a power on reset circuit;
   detection logic coupled to the power on reset circuit, the detection logic being enabled by the power on reset circuit when power is applied to the non-volatile memory, the detection logic adapted to detect an unprogrammed state of the non-volatile memory, the detection logic adapted to generate a signal which indicates an unprogrammed state; and
   a mode selection circuit coupled to the detection logic, in response to receiving the signal from the detection logic the mode selection circuit selecting a normal and an access restricted operational mode for the non-volatile memory.

2. The non-volatile memory of claim 1, wherein the detection logic evaluates a content of at least one storage location of the non-volatile memory.

3. The non-volatile memory of claim 2, wherein the detection logic comprises a comparator to compare the content to a predetermined logic value.

4. The non-volatile memory of claim 1, further comprising:

a memory array having a plurality of storage locations, the memory array having a plurality of rows and a plurality of columns, where each of the plurality of storage locations is identified by one row and one column;

row drivers coupled to the plurality of rows of the memory array;

column selects coupled to the plurality of columns of the memory array, wherein the row drivers and columns selects allow access to a random storage location within memory array; and enable logic which selects all rows and columns simultaneously for detecting whether all of the plurality of storage locations is in a unprogrammed state.

5. A microcontroller comprising:

a non-volatile memory for storing an application program;

a read only memory for storing a control program;

a processing unit coupled to the non-volatile memory and the read only memory;

detection logic for detecting an unprogrammed state of the non-volatile memory, the detection logic adapted to generate a signal which indicates an unprogrammed state; and control logic for selecting between the application program and the control program for execution by the processing unit based on the signal.

6. The microcontroller of claim 5, wherein the detection logic evaluates a content of at least one storage location of the non-volatile memory.

7. The microcontroller of claim 6, wherein the at least one storage location is a predefined location within the non-volatile memory for storage of a reset vector.

8. The microcontroller of claim 6, wherein the detection logic comprises a comparator to compare the content to a predetermined logic value.

9. The microcontroller of claim 7, wherein if the detection logic detects the unprogrammed state, the control logic issues an alternate reset signal to the processing unit, such that the processing unit accesses an alternate reset vector stored in the read only memory.

10. The microcontroller of claim 5, wherein the non-volatile memory further comprises row drivers and column selects for accessing a random storage location within the non-volatile memory; and wherein the non-volatile memory further comprises enabling logic for selecting all the rows and columns simultaneously to detect at least one programmed storage location.

11. The microcontroller of claim 5 comprised within an assembled electronic device.

12. A method for selecting an operational mode of a non-volatile memory having a normal and an access restricted operational mode, the method comprising the steps of:

performing a power on reset sequence;

detecting an unprogrammed state of the non-volatile memory based on a content of the non-volatile memory;

selecting the normal operational mode if the unprogrammed state is detected.

13. The method of claim 12, wherein the step of detecting further comprises the steps of:

reading a value stored in at least one storage location of the non-volatile memory; and comparing the value stored in the at least one storage location to a predetermined logic value representing the unprogrammed state.

14. The method of claim 12, wherein the step of detecting further comprises the steps of:

selecting all rows and all columns of the non-volatile memory;

simultaneously accessing all storage locations within the non-volatile memory; and determining if values stored in all storage locations store are equal to a predetermined logic value representative of the unprogrammed state.

15. A method for selecting an operational mode of a microcontroller, the microcontroller comprising a non-volatile memory, the microcontoller having a normal and a control operational mode, the method comprising the steps of:

resetting the microcontroller in the normal operational mode;

determining if the non-volatile memory is in an unprogrammed state; and selecting the control operational mode if the non-volatile memory is in the unprogrammed state.

16. The method of claim 15, wherein the step of determining further comprises the steps of:

reading a reset vector from a predetermined location within the non-volatile memory; and detecting if the reset vector corresponds to a predetermined value indicating an unprogrammed state.

17. The method of claim 15, wherein the step of selecting further comprises the steps of:

reading an alternate reset vector; and executing a control program indicated by the alternate reset vector.

18. The method of claim 15, wherein the step of determining further comprises the steps of:

enabling all rows and columns of the non-volatile memory for simultaneously accessing all storage locations within the non-volatile memory to determine whether contents of all storage locations are equal to a predetermined logic value being representative of the unprogrammed state.

19. A method for manufacturing an electronic device comprising the steps of:

mounting a microcontroller on a printed circuit of the electronic device, the microcontroller having a non-volatile memory;

powering the electronic device;

detecting if the non-volatile memory is unprogrammed;

invoking a control program which allows programming of the non-volatile memory within the printed circuit if the non-volatile memory is unprogrammed.

* * * * *